(12) United States Patent
Shaikevitch et al.

(10) Patent No.: US 7,973,465 B2
(45) Date of Patent: Jul. 5, 2011

(54) LIGHT EMITTING DIODE WITH THIN MULTILAYER PHOSPHOR FILM

(75) Inventors: Alex Shaikevitch, Livermore, CA (US); Rene Helbing, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/836,852

(22) Filed: Jul. 15, 2010

(65) Prior Publication Data

US 2011/0101395 A1 May 5, 2011

Related U.S. Application Data

(62) Division of application No. 12/611,364, filed on Nov. 3, 2009.

(51) Int. Cl.
*H01J 1/62* (2006.01)
(52) U.S. Cl. .......................... 313/498; 313/506
(58) Field of Classification Search ................... 313/498, 313/502, 504, 506, 509, 512
See application file for complete search history.

(56) References Cited

U.S. PATENT DOCUMENTS

| 5,408,026 | A | 4/1995 | Cowan | |
| 6,084,705 | A * | 7/2000 | Zieba et al. | 359/350 |
| 6,621,212 | B1 * | 9/2003 | Pennaz et al. | 313/506 |
| 2002/0140338 | A1 | 10/2002 | Sluzky | |
| 2005/0101158 | A1 | 5/2005 | Farnworth et al. | |
| 2008/0308828 | A1 | 12/2008 | Kashiwagi et al. | |
| 2009/0045422 | A1 | 2/2009 | Kato et al. | |

OTHER PUBLICATIONS

International Search Report and Written Opinion for the International Application No. PCT/US2010/054966, dated Mar. 14, 2011.

* cited by examiner

*Primary Examiner* — Vip Patel
(74) *Attorney, Agent, or Firm* — Arent Fox LLP

(57) ABSTRACT

A multiple layer film and a method of manufacturing the same, the film having a phosphor bearing layer including phosphor and a carrier, and a rigid protective layer. In some embodiments a mixture including phosphor and an uncurable fluid are dispensed onto a surface, and the mixture is at least partially dried. A curable fluid is dispensed onto the at least partially dried mixture, and the curable fluid is cured.

12 Claims, 3 Drawing Sheets

LIGHT EMITTING DIODE WITH THIN MULTILAYER PHOSPHOR FILM

CROSS-REFERENCE TO RELATED APPLICATION(S)

This is a Divisional Application which claims the benefit of pending U.S. patent application Ser. No. 12/611,364, filed on Nov. 3, 2009. The disclosure of the prior application is hereby incorporated herein in its entirety by reference.

BACKGROUND

1. Field

The present disclosure relates to light emitting diodes with a thin phosphor layer.

2. Background

Solid state devices, such as light emitting diodes (LED)s, are attractive candidates for replacing conventional light sources such as incandescent and fluorescent lamps. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Finally, LEDs require lower voltages than fluorescent lamps, and therefore, provide various power saving benefits.

LEDs produce light in a relatively narrow spectrum. To replace conventional lighting systems, LED-based sources that produce broad-spectrum (e.g., white) light are needed. One way to produce white light is to encapsulate blue or ultra-violet (UV) LEDs in a phosphor material. The phosphor material converts monochromatic light emitted from the blue or UV LEDs to white light.

The phosphor material is generally formed by introducing a suspension of phosphor particles into a carrier (e.g., silicone), encapsulating the LEDs in the carrier, and curing the carrier to provide a solid layer of material in which the phosphor particles will remain suspended. Unfortunately, silicone is a poor thermal conductor, and when illuminated, phosphors generate heat. Thus, when a phosphor-coated LED with a cured silicone carrier is used in a high-power application, the cured silicone may crack and/or have a reduced lifetime.

This property limits their use in high power LED applications which use temperature sensitive phosphor. Further, cracks in the phosphor and silicone composition reduce the efficiency of the device. Accordingly, there is a need in the art for simplified and improved processes for applying a phosphor material to LEDs and other solid state lighting devices.

SUMMARY

In one aspect of the disclosure, a method of manufacturing a film includes dispensing a mixture including phosphor and an uncurable fluid onto a surface, and at least partially drying the mixture. A curable fluid is dispensed onto the at least partially dried mixture, and the curable fluid is cured.

In another aspect of the disclosure, an article of manufacture is prepared by a process including dispensing a mixture including phosphor and an uncurable fluid onto a surface, and at least partially drying the mixture. A curable fluid is dispensed onto the at least partially dried mixture, and the curable fluid is cured.

In yet another aspect of the disclosure, an apparatus includes a phosphor bearing film including phosphor and a carrier, and a rigid film on the phosphor bearing film. The phosphor bearing film is 60%-80% phosphor.

In yet another aspect of the disclosure, an apparatus includes a phosphor bearing film including phosphor and an uncurable silicone carrier, and a cured silicone film on the phosphor bearing film. The cured silicone film is substantially free of phosphor.

It is understood that other aspects of the present invention will become readily apparent to those skilled in the art from the following detailed description, wherein it is shown and described only several aspects of a multilayer phosphor bearing film by way of illustration. As will be realized, the various aspects of the multilayer phosphor bearing film presented throughout this disclosure are capable of modification in various other respects, all without departing from the spirit and scope of the present invention. Accordingly, the drawings and the detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

Figure 1:
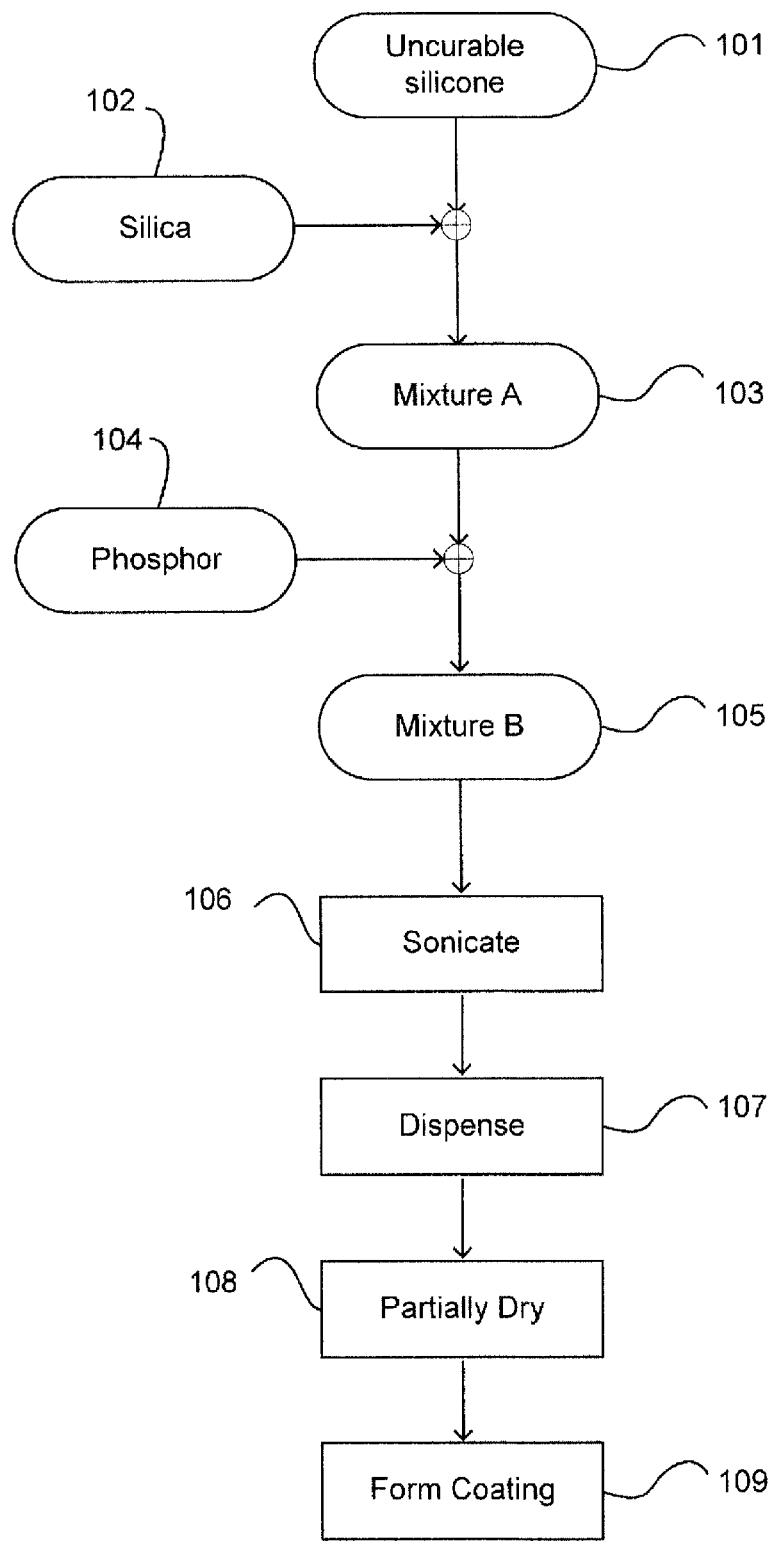
FIG. 1 is a flow chart illustrating an example of a process of manufacturing a film.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure will be thorough and complete, and will fully convey the scope of the present invention to those skilled in the art.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, dispensed, etched, attached, connected, coupled, or otherwise prepared or fabricated on the other element or an intervening element.

Various elements may be shown in the drawings with a particular orientation. By way of example, the drawings may show one element on "top" of or "above" another element. Conversely, the drawings may show one element on the "bottom" of or "below" another element. It will be understood that present invention is intended to encompass different orientations of an apparatus in addition to the orientation depicted in the drawings. By way of example, if an apparatus in the drawings is turned over, elements described as "below" or "beneath" other elements would then be oriented "above" the other elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of a multilayer phosphor bearing film for a solid state lighting device will now be presented. However, as those skilled in the art will readily appreciate, these aspects may be extended to other film applications without departing from the spirit and scope of the invention. The film may include a phosphor bearing layer with phosphor.

In many phosphor-coated light emitting diodes, the phosphor coating includes a suspension of phosphor particles in a silicone carrier, wherein the silicone carrier is cured to produce a solid layer in which the phosphor particles remain suspended. During use of the device, some of the light energy excites the phosphors and causes the emission of light at a different frequency. In addition, some of the light energy emitted from the LED is converted to heat. Thus, in high-power applications, a substantial amount of heat in the phosphor coating may be produced, potentially causing the silicone carrier to crack or otherwise reduce the lifetime of the device.

This issue may be addressed in part by utilizing a metallic package, which may include a metal or any metal-like structure with high thermal conductivity, for example, aluminum or copper, mounted on a heat sink. In this configuration, heat from the phosphor can travel downward, that is, through the LED die or directly through the package, to escape to the environment by way of the heat sink. However, in thick layers of phosphor suspended in a cured silicone carrier, the poor thermal conductivity of the silicone can limit the effectiveness of this configuration.

While thin phosphor layers may improve this situation, they are not without their own difficulties. A relatively thin phosphor layer may be created by suspending the phosphor within a low viscosity silicone (e.g., having a viscosity of 300-320 cP). However, the percentage of phosphor dispersed in this silicone is generally limited to 33-35%. Increases in phosphor concentration above this range may lead to difficulties in dispensing such as incomplete coverage of the die or dies, uneven surfaces, etc.

An improved thin layer of phosphor may be achieved by sedimentation. That is, the phosphor is dispensed into the package and/or onto the LED in a low viscosity silicone vehicle, and left (e.g., at room temperature) for a period of time to allow the phosphor to slowly sediment. As a result, a thin layer of phosphor is created on the die or dies, and on the surrounding areas, with a protective clear silicone layer on top. However, with this method, the sides of the dies are generally not covered with phosphor. It is well known that a significant portion of the light emitted by LED dies comes from the wall sides (e.g., up to 40%), so products produced utilizing this process may have inadequate efficiency. Further, a non-negligible amount of the phosphor remains in the clear silicone layer, resulting in compromised strength and hardness and reduced effectiveness of thermal dissipation.

A further improvement to an apparatus having a thin phosphor layer may be achieved by utilizing a process such as electrophoresis, in which an electric field applied to the suspension of phosphor in the silicone creates motion of the phosphor toward the surfaces on which it is desired that they settle, allowing a portion of the phosphor to settle on the side walls of the die. However, this process utilizes specialized equipment and generally implies a high level of investment. Further, the process may result in an only partial sedimentation, wherein the clear silicone layer is relatively soft and/or flexible, and again, the thermal dissipation is less effective than desired.

Moreover, neither of these processes appears to be capable of producing a satisfactorily thin phosphor layer including a high concentration of phosphor. An article of manufacture produced according to the process described below includes a phosphor-bearing layer having a concentration that may be from 60% to 80% phosphor.

As generally depicted in the flow chart of FIG. 1, a representative embodiment of the present invention provides a process for manufacturing a film. Uncurable silicone 101 and treated silica 102 are combined to form mixture A 103. The uncurable silicone may be a silicone fluid having a low viscosity, which does not substantially harden when subjected to a curing process. In some embodiments, the uncurable fluid may be a fluid other than silicone that provides for a suitable viscosity and binding of the mixture. Treated silica 102 may be a silica powder that has been treated with a coating of organic molecules that improve the dispersion of the silica in the silicone fluid. In some embodiments, the silica 102 may not be treated, and in some embodiments the silica 102 may be omitted in its entirety. Phosphor 104 is added to mixture A 103 to produce mixture B 105. Phosphor 104 may be a powder or other phosphor particles. Phosphor 104 may include one or more colors or types of phosphor generally adapted to emit visible light when excited by radiation from a device such as an LED. In some embodiments, an additional step includes adding a small amount of curable silicone to the phosphor bearing mixture to enable a degree of hardening of a phosphor carrier during the curing process, described later.

In block 106, mixture B 105 is stabilized by performing a sonication process. Sonication refers generally to the application of sound (e.g., ultrasound) energy to a composition, to agitate particles within the composition. This process stabilizes the mixture B 105, resulting in a substantially homogeneous suspension of phosphor in the silicone fluid.

In block 107, the stabilized mixture is dispensed onto a surface. The surface may be portions of a packaged and wire-bonded light emitting device, including a top and side surfaces of an LED, and an inner surface of the package itself. Here, an inner surface may be an inside surface of a concave or enclosed package, or a top surface of a substantially flat package, etc. Because the mixture may be substantially homogeneous, and with the addition of the treated silica to improve the viscosity and flow of the mixture, a uniform, concentrated phosphor bearing film is formed. In some embodiments the phosphor bearing film may be of a uniform thickness on the top and side wall surfaces of the LED die, as well as other surfaces of the package.

In block 108, the phosphor bearing film is at least partially dried. That is, heat and/or a partial vacuum may be applied to the film to evaporate at least a portion of at least one liquid constituent of the phosphor bearing film, such as the uncurable silicone 101. In some embodiments, partially drying as in block 108 results in a thick (i.e., highly viscous), paste-like semisolid film.

Figure 2:
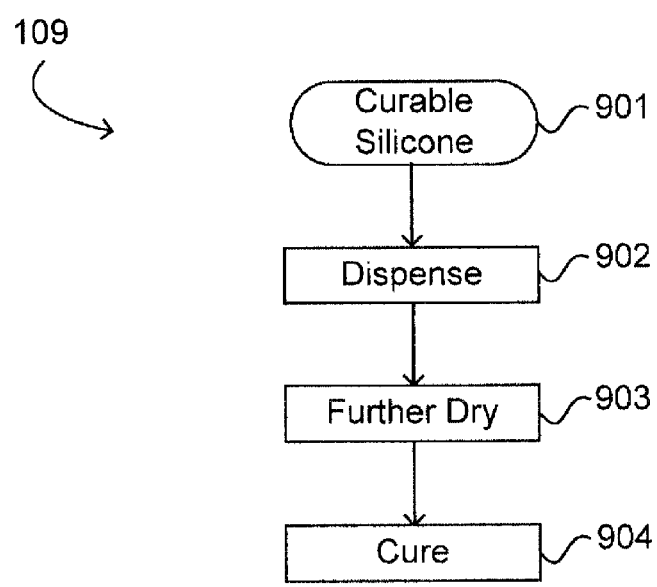
FIG. 2 is a flow chart illustrating a detail of the process of FIG. 1.

In block 109, a coating is formed onto the partially dried phosphor bearing film. FIG. 2 is an expanded flow chart illustrating further details of block 109.

Referring now to FIG. 2, in block 902, a curable silicone 901 is dispensed onto a surface of the partially dried phosphor bearing layer. The curable silicone 901 may be any suitable fluid such as silicone, which hardens or becomes more rigid when subjected to a curing process. In block 903, the film, including the partially dried phosphor bearing film and the curable silicone film, are subjected to a further drying process. That is, the partially dried phosphor bearing film is further dried by exposing the layers to a partial vacuum and/or a heightened temperature. In this way, at least one liquid constituent of the phosphor bearing film, such as the uncurable silicone, evaporates through the curable silicone film and the phosphor bearing film dries. In block 904, the film is subjected to a curing process, such that the curable silicone film hardens and forms a protective layer over the phosphor bearing film. The cured silicone film thus provides mechanical strength and protects the phosphor bearing film, while substantially not hindering the transfer of heat from the phosphor bearing film downward through the die and/or package to a heat sink.

As a detailed example, a process for manufacturing a film includes mixing 6.24 g of uncurable silicone fluid such as Dow Corning® OS-30 with 0.28 g of treated silica such as Cab-o-sil® TS-720 in a centrifugal mixer for 3 to 5 minutes at 1000 to 3000 RPM. (Dow Corning is a registered trademark of Dow Corning Corporation; Cab-o-sil is a registered trademark of Cabot Corporation). 1 g of phosphor is mixed into the mixture utilizing the same mixer. 0.12 to 0.16 g of curable silicone such as Dow Corning® JCR6122 is added to the composition, which is then sonicated for 1 to 2 minutes, for example utilizing a Hielscher® UP-400S at a power of 70 to 90 W. (Hielscher is a registered trademark of Dr. Hielscher GmbH). An amount, for example, a predetermined amount of the composition is dispensed into the package that includes a wire bonded LED die affixed to the package utilizing epoxy. The package is dried in a drying oven at 70 C and 10 inches Hg for 10-12 minutes, that is, until the phosphor-bearing composition acquires a thick, paste-like semisolid form. The package is taken out of the drying oven, and a thin layer of curable silicone, such as JCR6122 is dispensed on top of the partially dried phosphor bearing layer. The package is then returned to the drying oven, and further dried for 30 minutes at 30 inches Hg and 70 C. After the drying process, the package may be inspected for cracks in the phosphor bearing layer in and around the die area (minor cracking at a periphery of the inner surface of the package, for example, where a rubber ring is placed, may be acceptable). The package is then placed in a convection oven for 1 hour at 1500 to cure the curable silicone.

Figure 3:
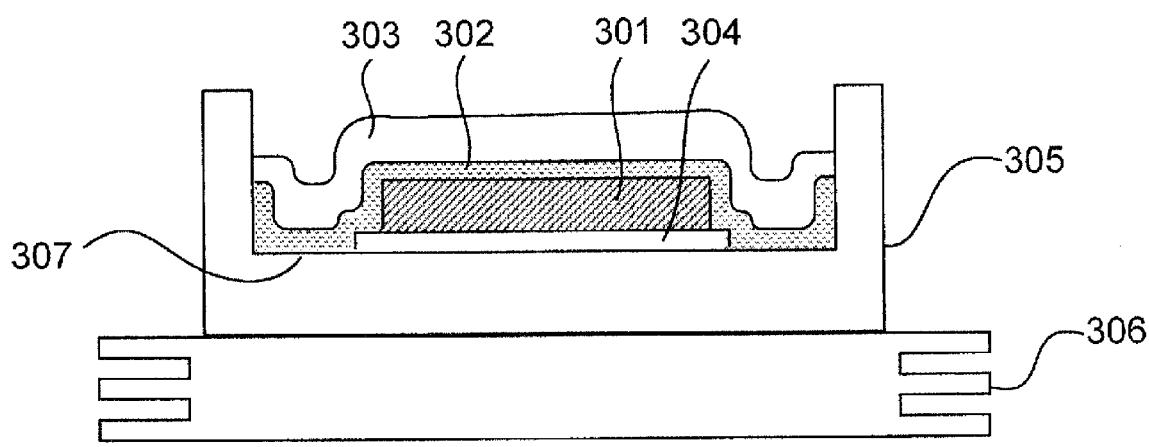
FIG. 3 is a schematic illustration showing a cross section of a light emitting device.

FIG. 3 is a schematic illustration of an exemplary apparatus, showing a cross-section of a light emitting device. A light emitting diode 301 is coated with a film including a phosphor bearing layer 302 and a rigid layer 303. The light emitting diode may be a semiconductor device or any other suitable device for emitting light. The phosphor bearing layer 302 may include a high concentration of phosphor (e.g., from 60% to 80% phosphor), and may include treated silica and an uncurable fluid such as uncurable silicone. According to various embodiments, the phosphor bearing layer 301 is substantially dry, that is, substantial portions of the uncurable fluid have been removed from the layer. The rigid layer 303 may be a silicone material that has been subjected to a curing process such that it provides a mechanical protective layer over the phosphor bearing layer 302. In some embodiments, the rigid silicone layer 303 is substantially free of phosphor, by virtue of it having been deposited after at least partially drying the phosphor bearing layer 302.

The LED 301 may be attached to a package 305 utilizing an adhesive 304. The adhesive may be any suitable material for fastening the die 301 to the package 305, such as epoxy. The package 305 may be any suitable material for potting or enclosing the light emitting device. In some embodiments, the package 305 is a metallic material, that is, any material with metal-like properties including a high thermal conductivity, thus enabling the dissipation of heat from the device to a heat sink 306. The heat sink 306 may be a thermally conductive apparatus for transferring heat from the light emitting device to the environment.

In the illustration, portions of the phosphor bearing film 302 are on an inner surface 307 of the package 305. Heat generated by the phosphor bearing layer 302 easily passes to the package 305 either at a direct point of contact at an inner surface 307 of the package 305, through the die 301, or through intermediate layers such as the epoxy layer 304.

The various aspects of a multilayer phosphor bearing film are provided to enable one of ordinary skill in the art to practice the present invention. Various modifications to, and alternative configurations of, the multilayer phosphor bearing films presented throughout this disclosure will be readily apparent to those skilled in the art, and the concepts disclosed herein may be extended to other lighting applications. Thus, the claims are not intended to be limited to the various aspects of this disclosure, but are to be accorded the full scope consistent with the language of the claims.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus comprising:
a light emitting device;
a phosphor bearing film arranged with the light emitting device, the phosphor bearing film comprising phosphor and a silicone carrier; and
a cured silicone film on the phosphor bearing film, the cured silicone film being substantially free of phosphor.

2. The apparatus of claim 1, wherein the phosphor bearing film is 60%-80% phosphor.

3. The apparatus of claim 1, wherein the phosphor bearing film is at least partially on the light emitting device.

4. The apparatus of claim 3, further comprising a metallic package, wherein the light emitting device is in the metallic package.

5. The apparatus of claim 4, wherein the phosphor bearing film is at least partially on a surface of the metallic package.

6. The apparatus of claim 5, further comprising a heat sink, wherein the package is on the heat sink.

7. An apparatus comprising:
a light emitting device;
a phosphor bearing film arranged with the light emitting device, the film comprising phosphor and a carrier, wherein the phosphor bearing film is 60%-80% phosphor; and
a rigid film on the phosphor bearing film.

8. The apparatus of claim 7 wherein the carrier comprises silicone.

9. The apparatus of claim 7 wherein the rigid film comprises a transparent cured silicone film.

10. The apparatus of claim 7, further comprising a metallic package, wherein the light emitting device is in the metallic package.

11. The apparatus of claim 10, wherein the phosphor bearing film is at least partially on a surface of the package.

12. The apparatus of claim 10, further comprising a heat sink, wherein the package is on the heat sink.

* * * * *